United States Patent
Figura

(10) Patent No.: US 6,373,084 B2
(45) Date of Patent: Apr. 16, 2002

(54) SHARED LENGTH CELL FOR IMPROVED CAPACITANCE

(75) Inventor: Thomas A. Figura, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/729,848

(22) Filed: Dec. 6, 2000

Related U.S. Application Data

(60) Continuation of application No. 09/436,213, filed on Nov. 9, 1999, now Pat. No. 6,180,452, which is a division of application No. 09/099,765, filed on Jun. 19, 1998, now Pat. No. 6,025,624.

(51) Int. Cl.[7] ............................................. H01L 27/108
(52) U.S. Cl. ..................... 257/296; 257/306; 257/307; 257/308; 257/309; 438/253; 438/396; 438/398
(58) Field of Search ................................ 257/296, 306, 257/307, 308, 309; 438/253, 396, 398

(56) References Cited

U.S. PATENT DOCUMENTS

| 5,241,201 A | 8/1993 | Matsuo et al. ............... 257/309 |
| 5,262,662 A | 11/1993 | Gonzalez et al. ........... 257/307 |
| 5,270,241 A | 12/1993 | Dennison et al. ........... 438/396 |
| 5,278,091 A | 1/1994 | Fazan et al. ................. 438/398 |
| 5,391,511 A | 2/1995 | Doan et al. .................. 438/396 |
| 5,401,681 A | 3/1995 | Dennison ..................... 438/253 |
| 5,453,633 A | 9/1995 | Yun ............................. 257/306 |
| 5,488,011 A | 1/1996 | Figura et al. ................ 438/253 |
| 5,563,089 A | 10/1996 | Jost et al. .................... 438/396 |
| 5,565,372 A | 10/1996 | Kim ............................. 438/253 |
| 5,597,756 A | 1/1997 | Fazan et al. ................. 438/398 |
| 5,661,064 A | 8/1997 | Figura et al. ................ 438/396 |
| 5,696,014 A | 12/1997 | Figura ........................ 438/398 |
| 5,714,402 A | * 2/1998 | Choi ........................... 438/396 |
| 5,904,521 A | 5/1999 | Jeng et al. ................... 438/253 |
| 5,930,623 A | 7/1999 | Wu .............................. 438/253 |
| 5,930,625 A | * 7/1999 | Lin et al. ..................... 438/253 |
| 5,937,290 A | 8/1999 | Sekiguchi et al. .......... 438/238 |
| 5,998,256 A | 12/1999 | Juengling .................... 438/253 |
| 5,998,259 A | 12/1999 | Chuang ....................... 438/253 |
| 6,004,859 A | 12/1999 | Lin ............................. 438/398 |

OTHER PUBLICATIONS

M. Sakao et al., A Capacitor–Over–Bit–line (COB) Cell With a Hemispherical–Grain Storage Node for 64 Mb DRAMs, pp. 27.3.1–27.3.4., IEDM, 1990.

S. Inoue, et al., A Spread Stacked Capacitor (SSC) Cell for 64Mbit DRAMS, pp. 2.3.1–2.2.4., IEDM, 1989.

* cited by examiner

Primary Examiner—Michael S. Lebentritt
Assistant Examiner—Christian D. Wilson
(74) Attorney, Agent, or Firm—Dickstein Shapiro Morin & Oshinsky LLP

(57) ABSTRACT

A container capacitor having an elongated storage electrode for enhanced capacitance in a dynamic random access memory circuit. The electrode is preferably twice the length of the typical cell and may be coated with hemispherical-grain polysilicon to further increase the surface area of the electrode.

10 Claims, 16 Drawing Sheets

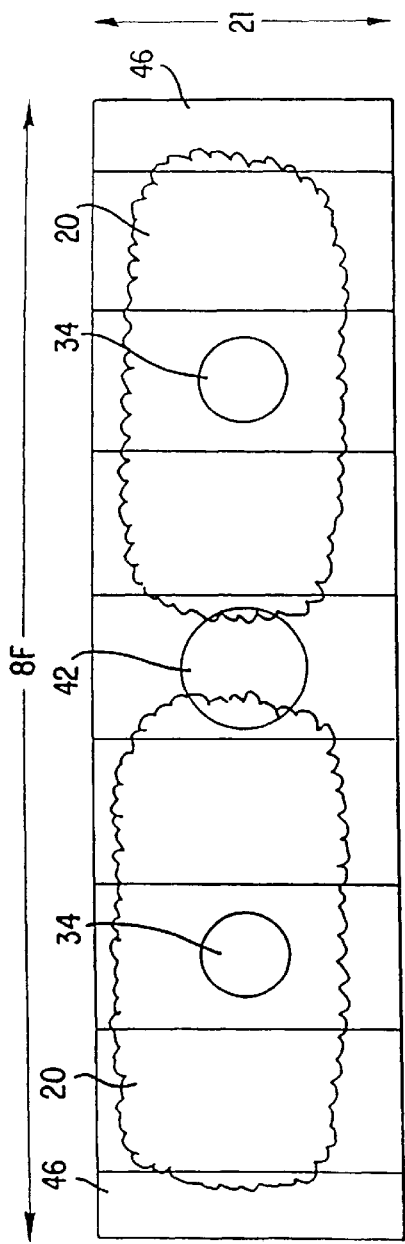
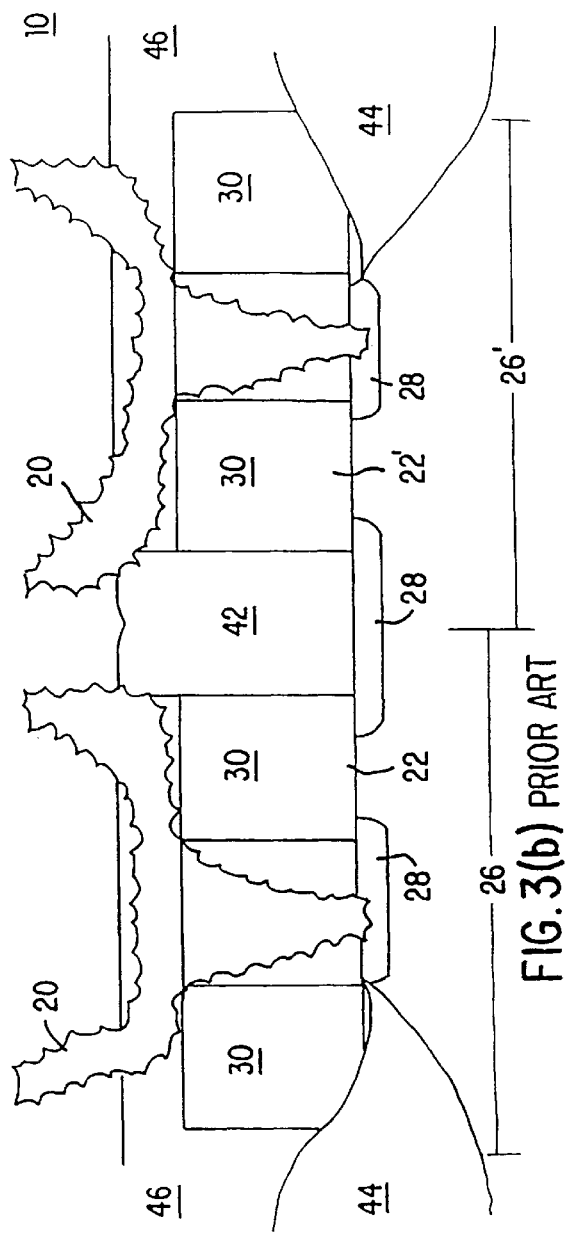
FIG. 3(a) PRIOR ART
FIG. 3(b) PRIOR ART

SHARED LENGTH CELL FOR IMPROVED CAPACITANCE

This is a continuation application of U.S. patent application Ser. No. 09/436,213, filed Nov. 9, 1999 now U.S. Pat. No. 6,180,452, which is a divisional application of U.S. patent application Ser. No. 09/099,765, filed Jun. 19, 1998, now U.S. Pat. No. 6,025,624, the entirety of which is herein incorporated by reference.

FIELD OF THE INVENTION

This invention relates generally to semiconductor memory storage devices, and more particularly to the design of capacitor electrodes for use in integrated circuits.

BACKGROUND OF THE INVENTION

Capacitors are used in a wide variety of semiconductor circuits. Because capacitors are of special importance in dynamic random access memory (DRAM) circuits, the invention will therefore be discussed in connection with DRAM circuits. However, the invention has broader applicability to any other memory circuits in which capacitors are used.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

FIG. 1 illustrates a portion of a DRAM memory circuit containing two neighboring DRAM cells 10. For each cell, the capacitor 14 has two connections, located on opposite sides of the capacitor 14. The first connection is to a reference voltage, which is typically one half of the internal operating voltage (the voltage corresponding to a logical "1" signal) of the circuit. The second connection is to the drain of the FET 12. The gate of the FET 12 is connected to the word line 18, and the source of the FET is connected to the bit line 16. This connection enables the word line 18 to control access to the capacitor 14 by allowing or preventing a signal (a logic "0" or a logic "1") on the bit line 16 to be written to or read from the capacitor 14.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip.

Because the capacitor in a memory cell usually occupies a large portion of the cell area, many efforts at achieving higher cell packing density focus on reducing the semiconductor area occupied by the capacitor. Maintaining or increasing capacitance of a capacitor as its relative area is decreased is necessary not only to maintain charge at the refresh rates used, but also to facilitate information detection and decrease soft errors resulting from alpha particles.

In order to minimize the area occupied by a capacitor and maximize capacitance, various storage cell designs have been developed, including planar capacitors, stacked capacitor (STC) cells, and trench capacitors. Planar capacitors are located next to the transistor, stacked capacitors are stacked or placed over the access transistor, and trench capacitors are formed in the wafer substrate beneath the transistor. Most large capacity DRAMs use stacked capacitors because of their greater capacitance, reliability, and ease of formation.

One widely used type of stacked capacitor is known as a container capacitor. Known container capacitors are in the shape of an upstanding tube having an oval or cylindrical shape when viewed from the top down. The wall of the tube consists of two plates of conductive material such as doped polycrystalline silicon (referred to herein as polysilicon) separated by a dielectric. The bottom end of the tube is closed. The outer wall is in contact with either the drain of the access transistor or a plug which itself is in contact with the drain. The other end of the tube is open (the tube is filled with an insulative material later in the fabrication process). The sidewall and closed end of the tube form a container, hence the name "container capacitor."

In addition, methods of forming a rough surface on the storage electrode of a capacitor have been developed to increase the capacitance by increasing the surface area of the storage electrode. One of the most successful techniques for creating a rough surface is the formation of hemispherical-grain (HSG) polysilicon nodules on the surface of the storage electrode.

As memory cell density continues to increase, efficient use of space becomes ever more important. Therefore, what is needed is a capacitor that maximizes surface area without increasing the proportion of cell area occupied by the capacitor relative to the other cell components.

SUMMARY OF THE INVENTION

The present invention provides an improved storage electrode for a container capacitor formed to span more than one cell in length. The narrow, elongated capacitor has a larger perimeter, resulting in increased capacitor wall area and therefore increased capacitance over the typical capacitor, without increasing the amount of cell area occupied by the capacitor. Methods for forming the improved storage electrode capacitor are also disclosed.

Advantages and features of the present invention will be apparent from the following detailed description and drawings which illustrate preferred embodiments of the invention.

BRIEF DESCRIPTION OF THE DRAWINGS

FIG. 3A is a top view of a known memory circuit showing a conventional capacitor storage electrode;

FIG. 3B is a side view of a cross section of the known memory circuit of FIG. 3A;

DETAILED DESCRIPTION OF THE PREFERRED EMBODIMENT

Figure 1:
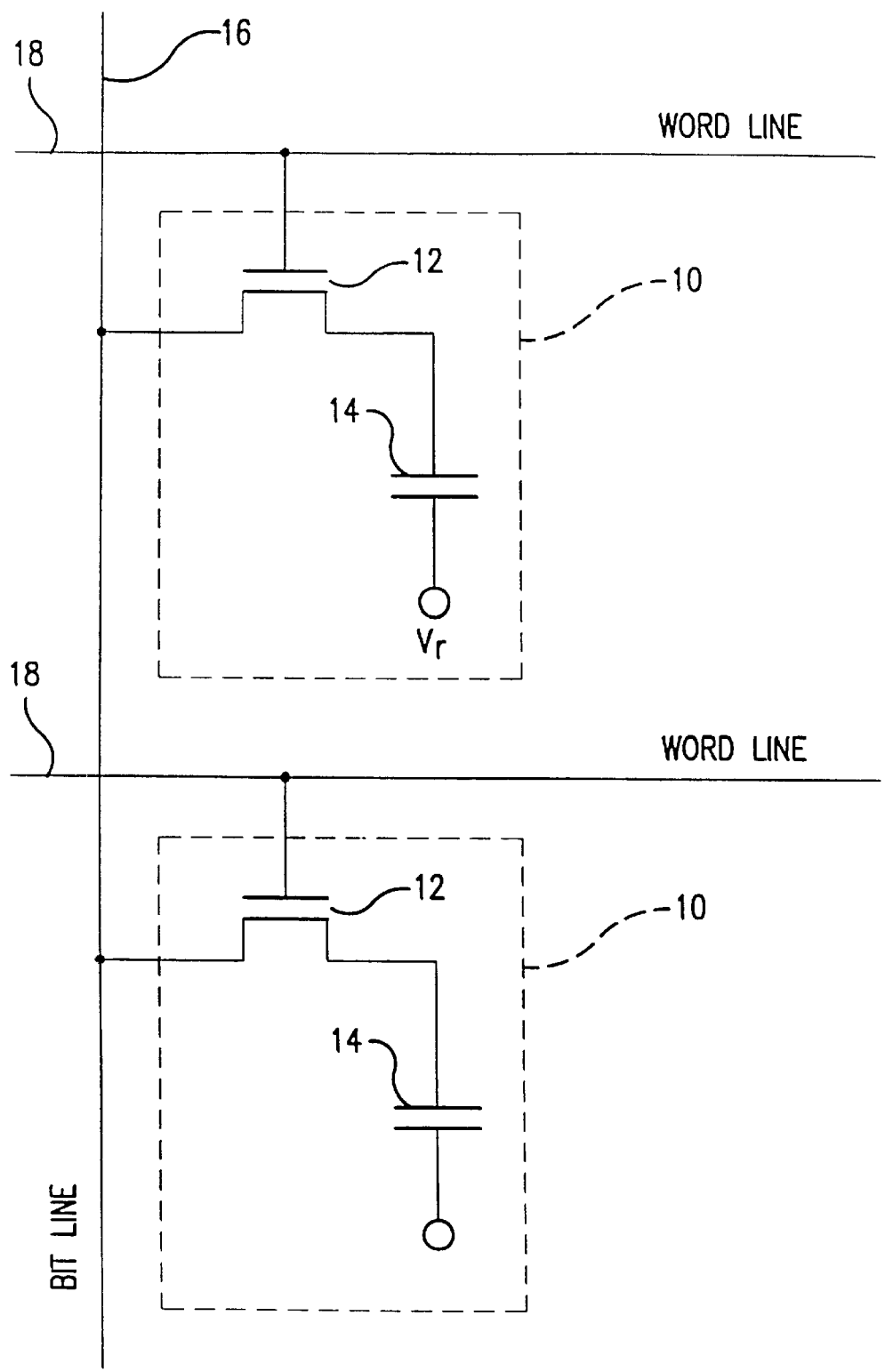
FIG. 1 is a circuit diagram of a portion of a conventional DRAM memory circuit.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the structure of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

Exemplary constructions of fabrication processes for container capacitors according to several embodiments of the present invention are described below. It is to be understood, however, that these processes are only a few examples of many possible processes. For example, the capacitor is formed over the bit-line in the following process, but the bit-line could also be formed over the capacitor. Variants in the masking and etching processes are also contemplated, as are variations in the structure that retain the spirit of the invention. The following detailed description is, therefore, not to be taken in a limiting sense.

Referring now to the drawings, where like elements are designated by like reference numerals, an embodiment of the capacitor storage electrode array 10 of the present invention is shown in FIG. 2. The capacitor storage electrode array 10 is comprised of a plurality of storage electrodes 20 associated with access field effect transistors (FETS) 22 on a semiconductor wafer 24. Each storage electrode 20 and its associated access FET 22 correspond to a memory cell 26 suitable for use in a DRAM or other memory array.

Figure 2A:
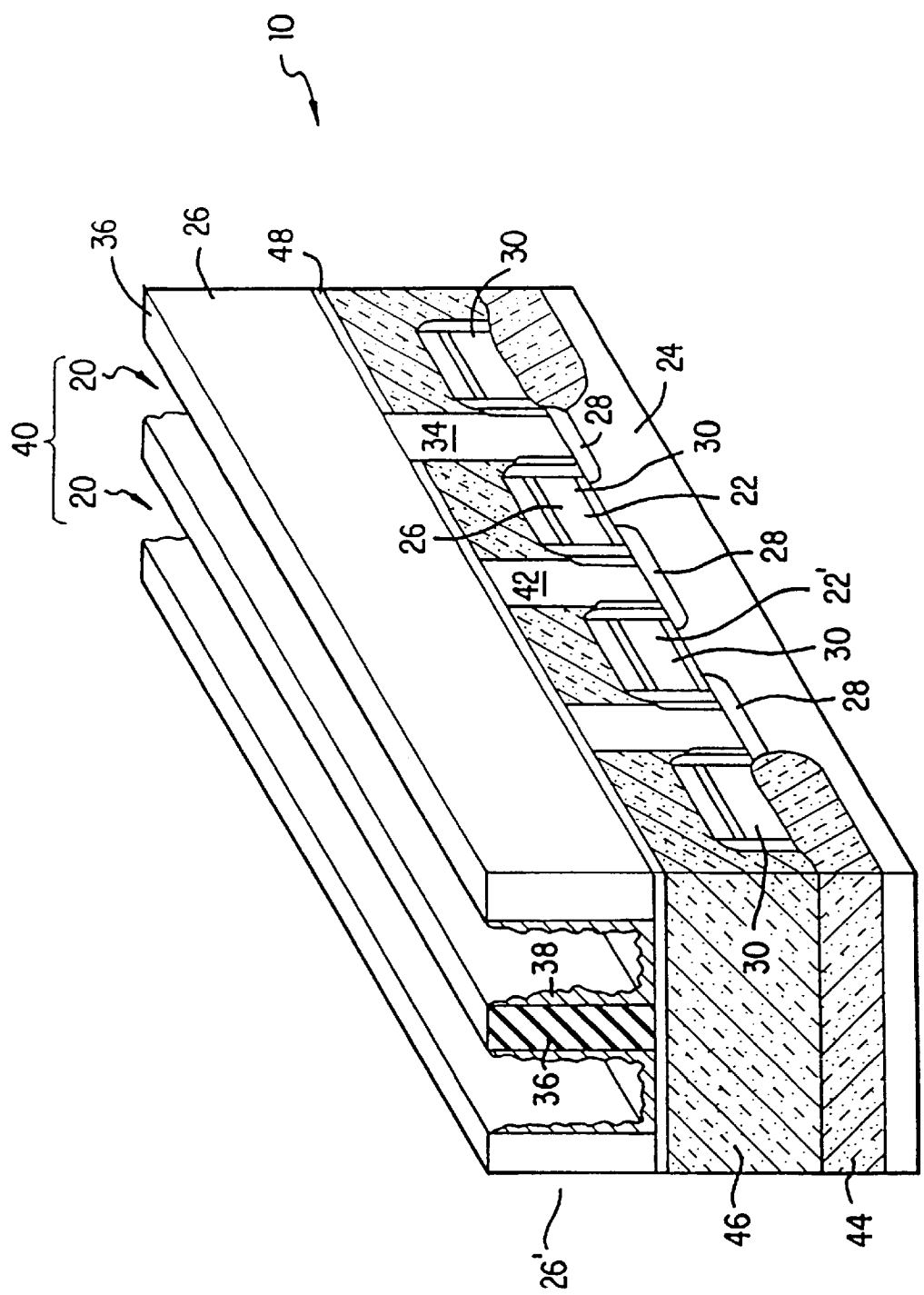
FIG. 2A is a perspective view of one embodiment of a memory circuit according to the present invention showing a capacitor storage electrode.
Figure 2B:
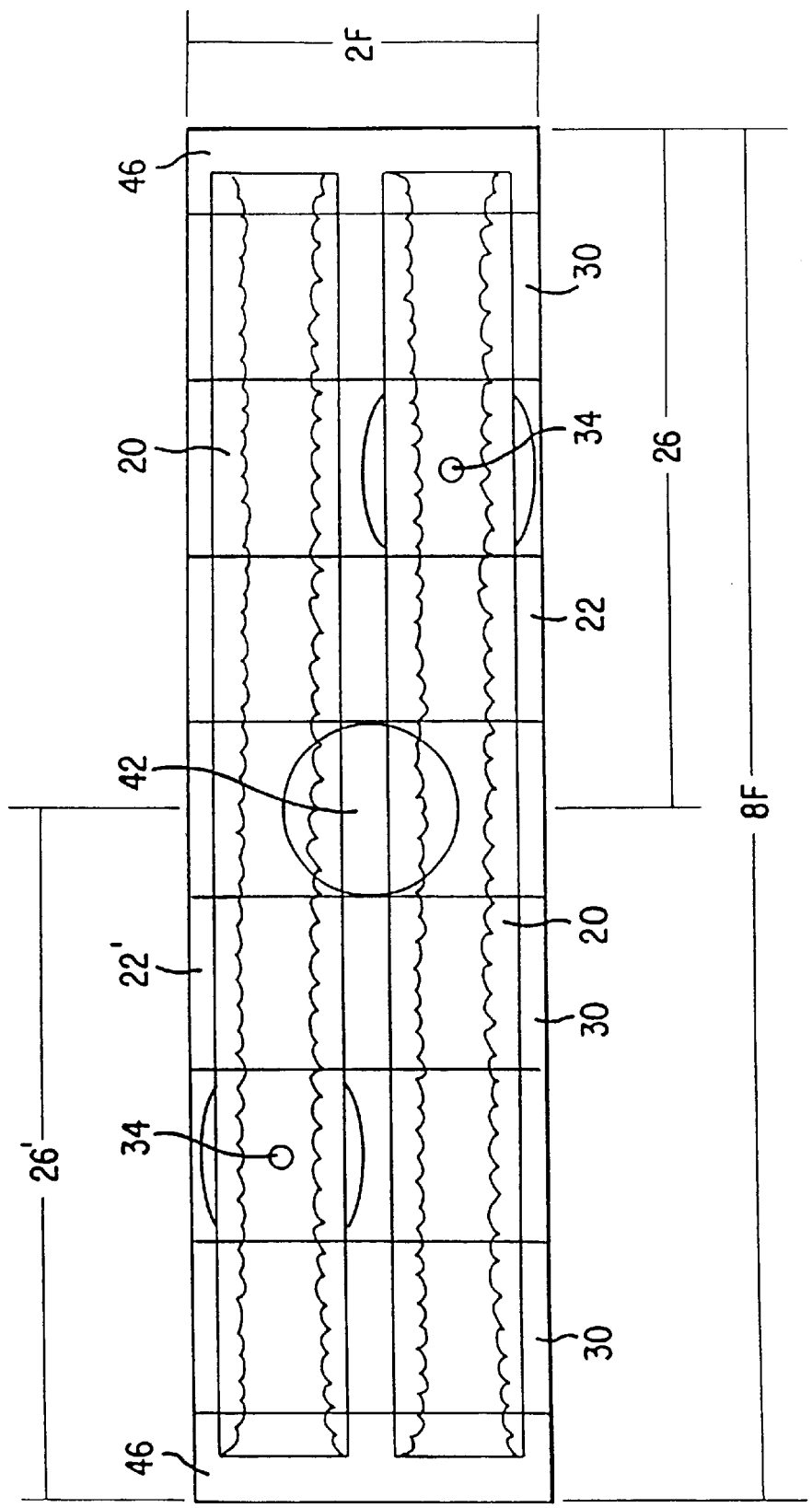
FIG. 2B is a top view of the perspective view of FIG. 2A.

The wafer 24 comprises a bulk semiconductor substrate having electrically conductive diffusion regions 28, word lines 30, and bit lines (not shown) formed therein, as can be seen by referring to FIG. 2. The structure shown in FIGS. 2(a) and 2(b) is a buried bit line or capacitor-over-bit line structure, in which the capacitor storage electrode array 10 is formed over the bit lines.

Each storage electrode 20 is connected to the diffusion region 28 via a polysilicon plug 34, and to the bit line via a polysilicon plug 42. The storage electrodes 20 comprise insulative film runners 36 coated with a layer of hemispherical-grain (HSG) polysilicon 38 or another conductive layer. The storage electrodes 20 are arranged in complementary pairs 40 parallel to one another, as can best be seen in FIG. 2(b). Each complementary pair 40 of storage electrodes 20 relates to two cells 26, 26', with the storage electrode 20 of each cell extending over that cells access FET 22 to partially or completely cover the access FET 22' of the complementary cell 26' as well. Each storage electrode 20 comprises two runners 36 that are partially coated with HSG polysilicon 38, as shown in FIG. 2(a). The storage electrode 20 has a U-shaped cross section due to the shape of the HSG layer 38. Oxide layers 44, 46 serve to insulate active regions of the cell 26 from each other. Insulation layer 48 isolates the storage electrode 20 from the underlying active regions.

FIG. 2(b) depicts a storage electrode array 10 in which the storage electrodes 20 extend over the length of the related pair of cells. Each storage electrode 20 has a perimeter of well over 12F, preferably at least about 15 up to 18F, where F is the minimum feature size. The storage electrodes 20 of FIG. 2(b) may be seen to cross over four word lines. A variant structure in which the storage electrodes 20 of each cell 26 extend only partially over the complementary cell 26', providing each storage electrode 20 with a perimeter in the range of about 12 to 15F, where F is the minimum feature size is also contemplated, but not shown. In such a variant structure the storage electrodes 20 would cross over at least three word lines, but less than four word lines.

Referring now to FIG. 3, depicting a known container capacitor storage electrode, the advantages of the present invention can be identified. The storage electrode of FIG. 3 has a perimeter of well under 12F, where F is the minimum feature size. However, referring now to FIGS. 2 and 3, it is evident that while both capacitor storage electrodes have a similar area, the storage electrode of FIG. 2 has a much greater perimeter than that of FIG. 3. The novel structure of the storage electrode of the embodiment depicted in FIG. 2 enables the storage electrode to maintain the same area as the known electrode while greatly increasing the perimeter of the capacitor and thereby increasing its container wall area and capacitance. This advantage is possible due to the shared length capacitors of the invention, wherein each capacitor storage node has a length which extends over its adjacent cell, and has a width which accommodates the extended length capacitor node of the adjacent cell.

The capacitor storage electrode array 10 is manufactured through a process described as follows, and illustrated by FIGS. 4 through 8. The process begins at a point in the DRAM manufacturing sequence that follows formation of field effect transistors, diffusion regions, word lines and bit lines on a semiconductor wafer 24.

Figure 4:
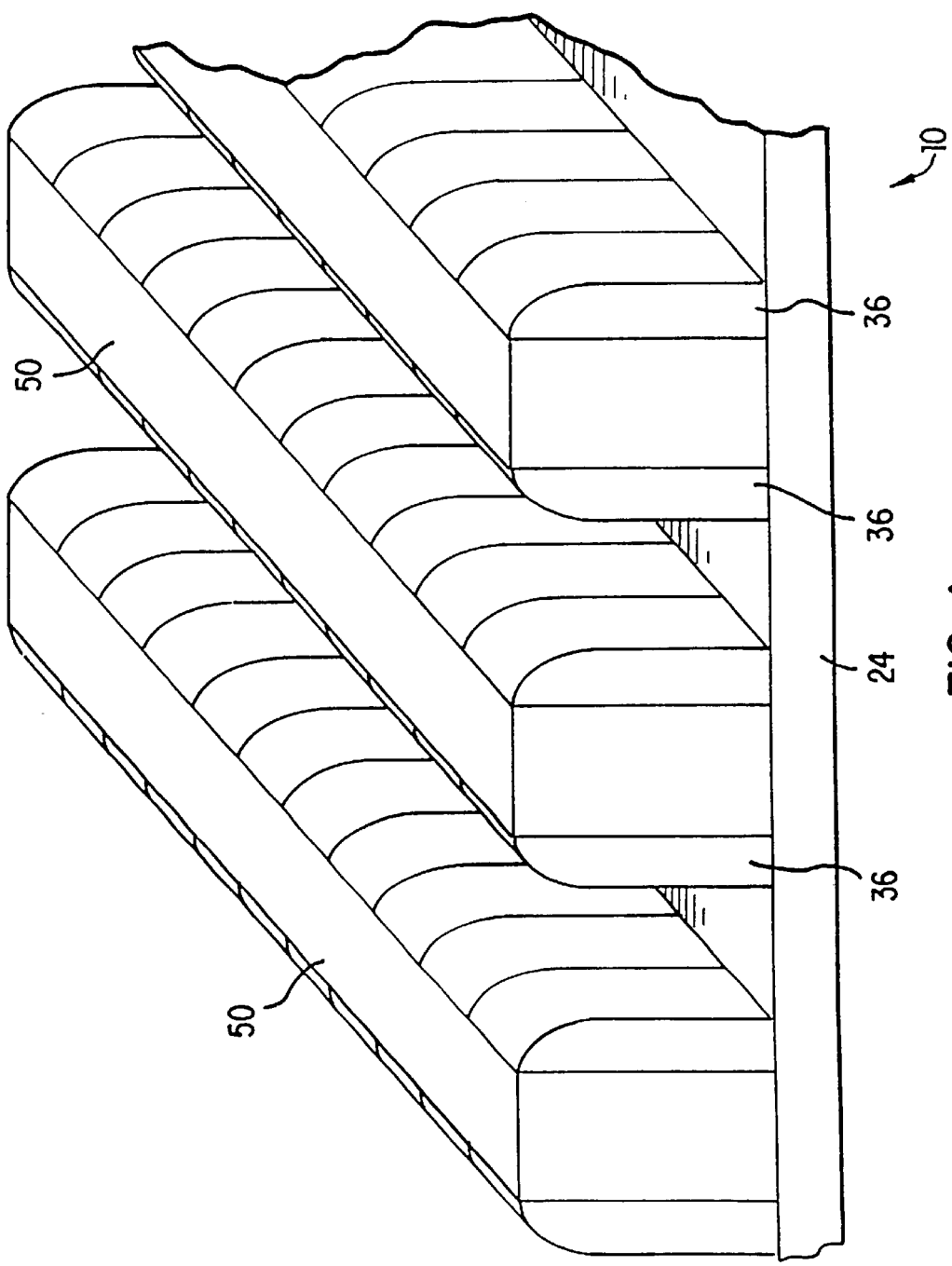
FIG. 4 is a perspective view of a portion of a semiconductor wafer at an early processing step according to one embodiment of the present invention.

As seen in FIG. 4, formation of the storage electrode array 10 begins with deposition and subsequent etching of a sacrificial mold layer (not shown) on top of the wafer 24. The sacrificial mold layer may comprise borophosphosilicate glass (BPSG), silicon dioxide, or another substance that is selectively etchable. A "sacrificial" layer is one which is used only during fabrication and which will not be present in the final product. The mold layer may be deposited using well-established deposition techniques such as chemical vapor deposition (CVD). A resist and mask are applied, and photolithographic techniques are used to define areas to be etched out. A directional etching process such as reactive ion etching (RIE) is used to etch through the mold layer to form parallel molding bars 50, resulting in the structure shown in FIG. 4.

The next step is the formation of insulating runners 36 on the sides of the molding bars 50, as seen in FIG. 4. The insulating runners 36 are formed by deposition of an insulating layer (not shown) of silicon nitride or silicon oxide on the sides of the molding bars 50, and by subsequent directional etching to shape the runners 36, and to leave the top surface of the molding bars 50 exposed. The resultant parallel runners 36 are shown most clearly in FIG. 4.

Figure 5:
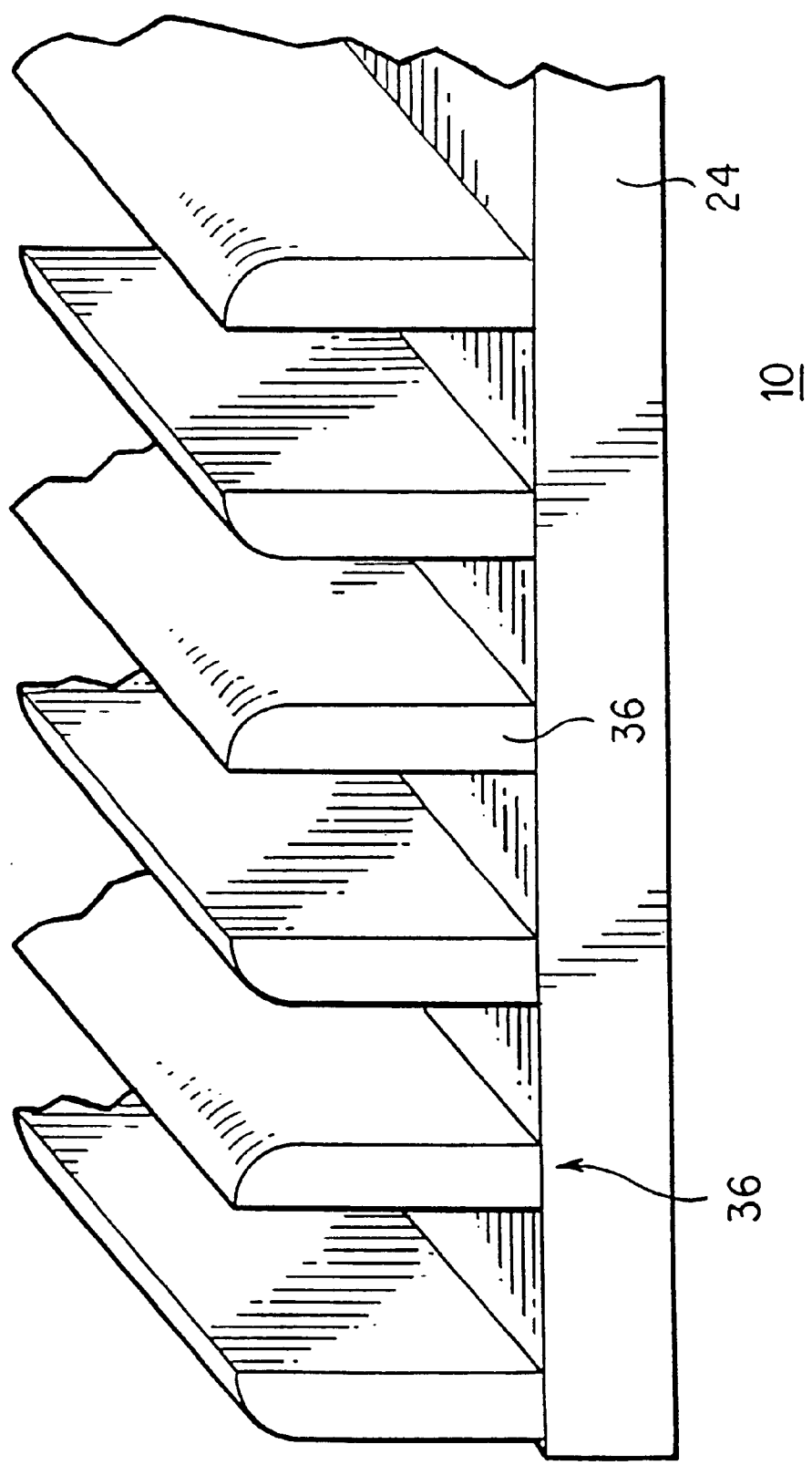
FIG. 5 is a perspective view of a portion of a semiconductor wafer at a processing step subsequent to that shown in FIG. 4.
Figure 6:
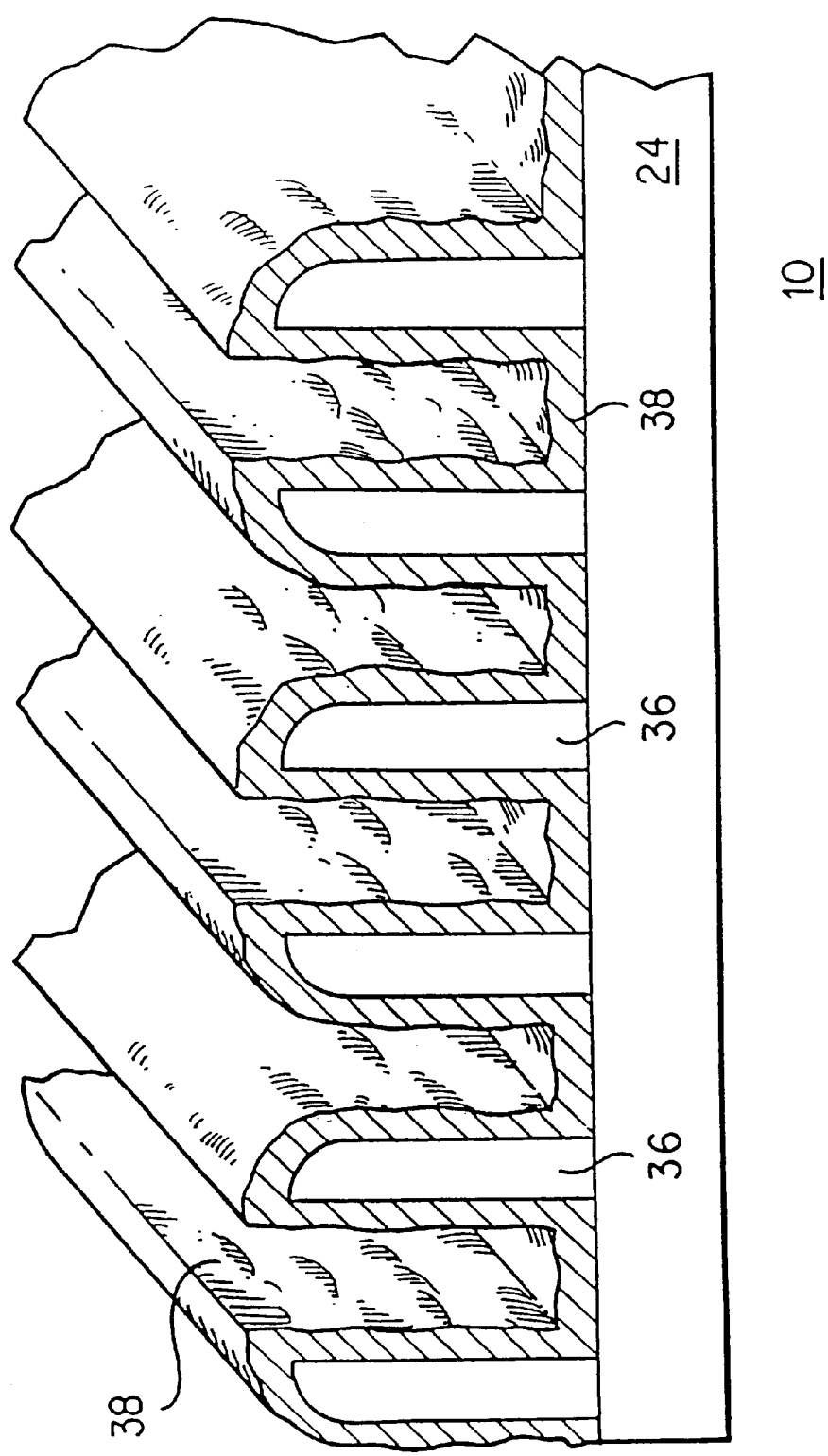
FIG. 6 is a perspective view of a portion of a semiconductor wafer at a processing step subsequent to that shown in FIG. 5.

The sacrificial molding bars 50 are then removed by an etching process, preferably with a wet etch that is selective for BPSG over silicon. The resultant structure is shown in FIG. 5. Referring now to FIG. 6, a conductive layer 38 is then deposited or formed on the inner and outer surfaces of the runners 36. The conductive layer 38 may be formed of polysilicon, hemispherical-grain (HSG) polysilicon, titanium nitride, or the like, but is preferably HSG polysilicon. The HSG polysilicon layer 38 may be formed by low pressure chemical vapor deposition (LPCVD) of polysilicon under carefully controlled pressure and temperature so that nucleation occurs. Deposition of HSG polysilicon may be carried out in helium-diluted $SiH_4$ gas at 1.0 torr pressure and 550° C. The thickness of the HSG polysilicon layer 38 is preferably less than one-half of the runner-to-runner distance.

Figure 7:
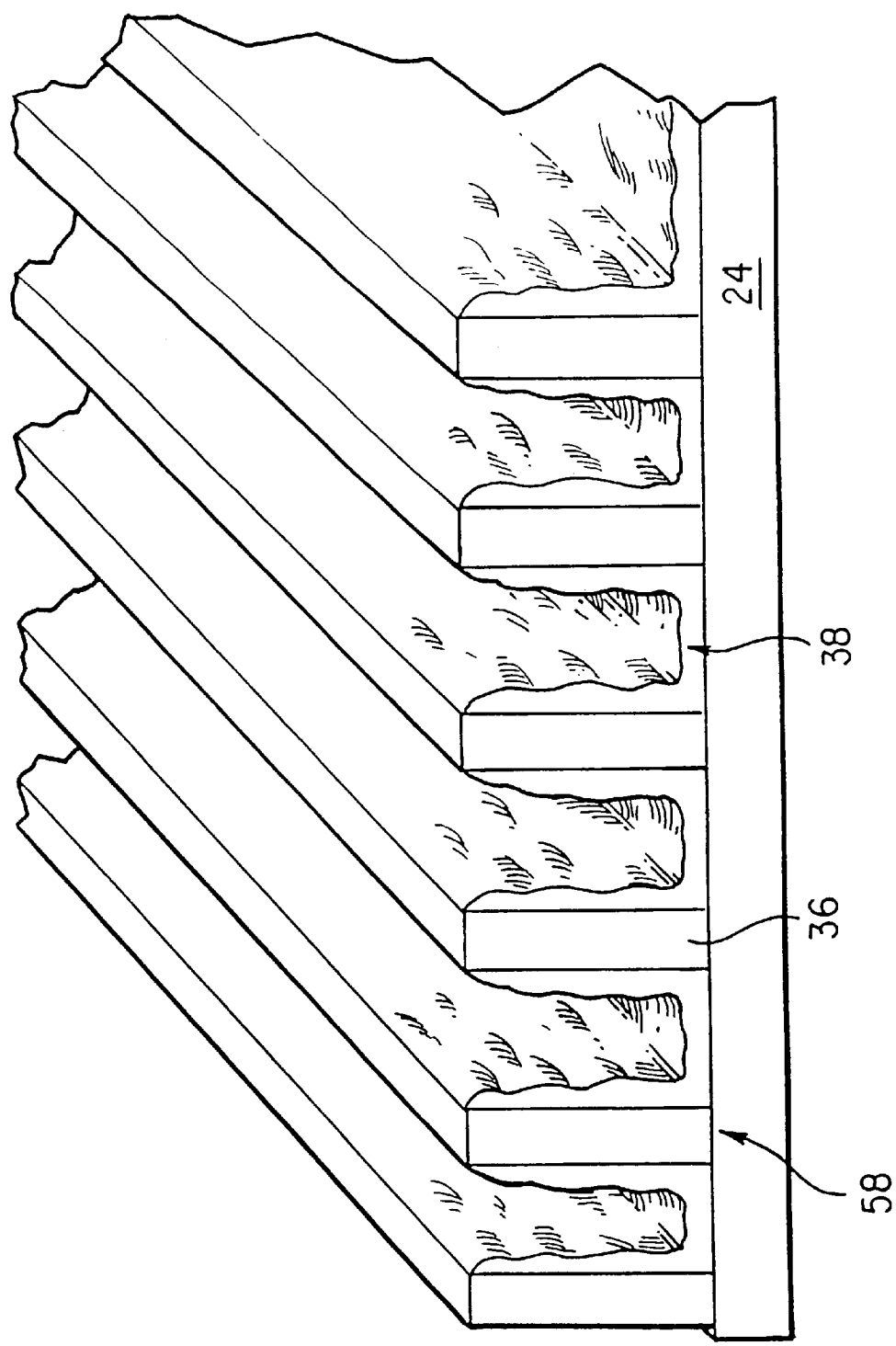
FIG. 7 is a perspective view of a portion of a semiconductor wafer at a processing step subsequent to that shown in FIG. 6.
Figure 8:
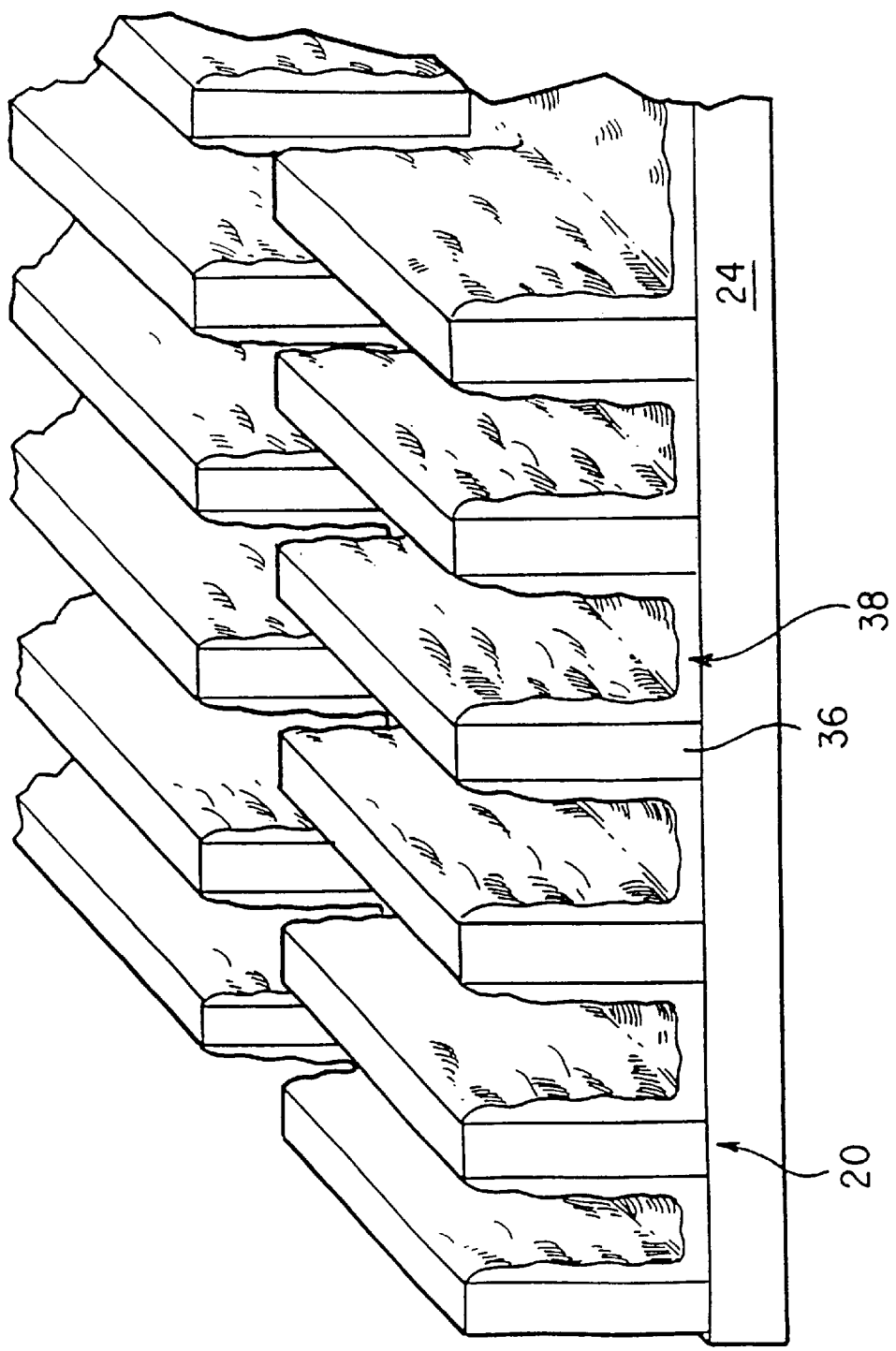
FIG. 8 is a perspective view of a portion of a semiconductor wafer at a processing step subsequent to that shown in FIG. 7.

Referring now to FIGS. 7 and 8, the runners 36 are formed into individual storage electrodes 20. First, chemical-mechanical polishing (CMP) or other planarization methods are used to remove HSG from the top surfaces of the runners 36, forming parallel storage electrode bars 58, as can be seen in FIG. 7. Then a resist and mask are applied, and a directional etching process such as RIE is used to separate the storage electrode bars 58 into storage electrodes 20, as shown in FIG. 8. Conventional processing is then performed to construct the remainder of the capacitor and to finish the array 10. For example, a capacitor dielectric layer is provided over the storage electrodes 20. The dielectric layer is deposited with a thickness such that the capacitor openings are not completely filled. The dielectric layer preferably comprises an oxide-nitride-oxide (ONO) dielectric, although other materials are of course possible. A second conductive layer is then deposited over the dielectric layer. The second conductive layer is preferably composed of polysilicon. In addition to serving as the second or upper electrode of the capacitor, the second conductive layer also forms the interconnection lines between the second electrodes of the capacitors. The second electrode is the electrode of the capacitor that is connected to the reference voltage as discussed in connection with FIG. 1. In this manner, active areas 28 are also electrically isolated (without the influence of the gate). A damascene or other inter-metal backend process then completes the remaining circuit elements, thereby forming the DRAM of the preferred embodiments.

Figure 9:
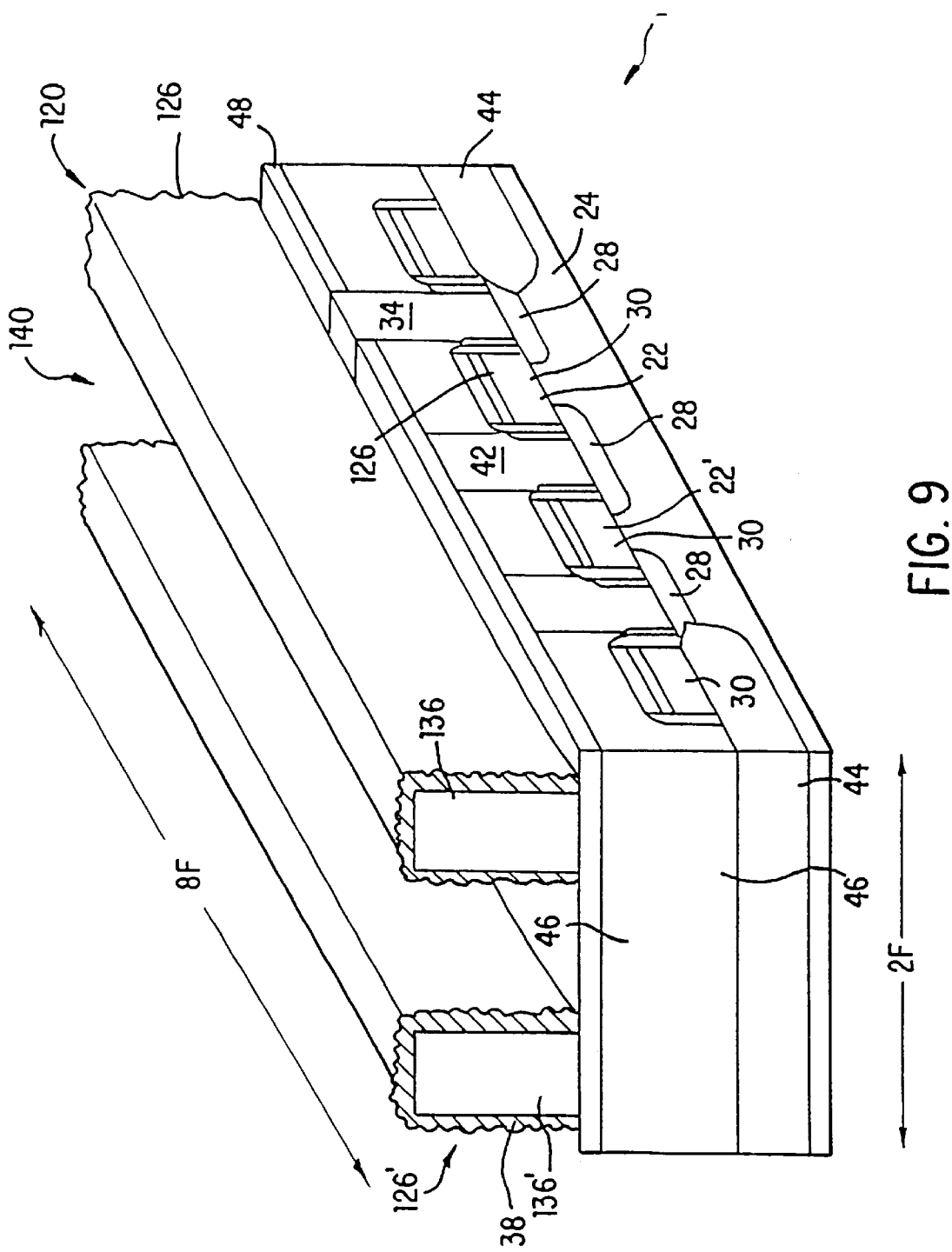
FIG. 9 is a perspective view of a second embodiment of the present invention.

Referring now to FIGS. 9 through 15, a second embodiment of the capacitor storage electrode array 110 of the present invention is shown in FIG. 9. The capacitor storage electrode array 110 is comprised of a plurality of storage electrodes 120 associated with access field effect transistors (FETS) 22 on a semiconductor wafer 24. Each storage electrode 120 and its associated access FET 22 corresponds to a memory cell 126 suitable for use in a DRAM or other memory array.

The wafer 24 comprises a bulk semiconductor substrate having an electrically conductive diffusion region 28, with word lines 30, and bit lines (not shown) formed therein, as can be seen by referring to FIG. 9. The structure shown in FIG. 9 is also a buried bit line structure, in which the capacitor storage electrode array 110 is formed over the bit lines.

Each storage electrode 120 is connected to diffusion regions 28 via a polysilicon plug 34, and to the bit line via a polysilicon plug 42. The storage electrodes 120 comprise conductive polysilicon runners 136, optionally coated with a layer of hemispherical-grain (HSG) polysilicon 38 or other conductive material. Oxide layers 44, 46 serve to insulate active regions of the cell 126 from each other, and insulation layer 48 isolates the storage electrode 120 from the underlying active regions. The storage electrodes 120 are arranged in complementary pairs 140 arranged parallel to one another, as can best be seen in FIG. 9. Each complementary pair 140 of storage electrodes 120 relates to two cells 126, 126', with the storage electrode 120 of each cell extending over that cell's access FET 22 to partially or completely cover the access FET 22' of the complementary cell as well. Each storage electrode 120 comprises one runner 136, 136', optionally coated with HSG polysilicon 38, as shown in FIG. 9, resulting in a storage electrode 120 having a rectangular cross section.

FIG. 9 depicts a storage electrode array 110 in which the storage electrodes 120 extend over the length of the related pair of cells. Each storage electrode has a perimeter of at least about 17F, where F is the minimum feature size. The storage electrodes 120 of FIG. 9 may be seen to cross over four word lines. An alternative structure (not shown) may be formed in which the storage electrodes of each cell extend only partially over the complementary cell, providing each storage electrode with a perimeter of between 12 and 15F, where F is the minimum feature size. The alternative storage electrodes cross over at least three, but less than four word lines.

The capacitor storage electrode array 110 is manufactured through a process described as follows, and illustrated by FIGS. 10 through 15. The process begins at a point in the DRAM manufacturing sequence that follows formation of field effect transistors, diffusion regions, word lines and bit lines on a semiconductor wafer 24.

Figure 10:
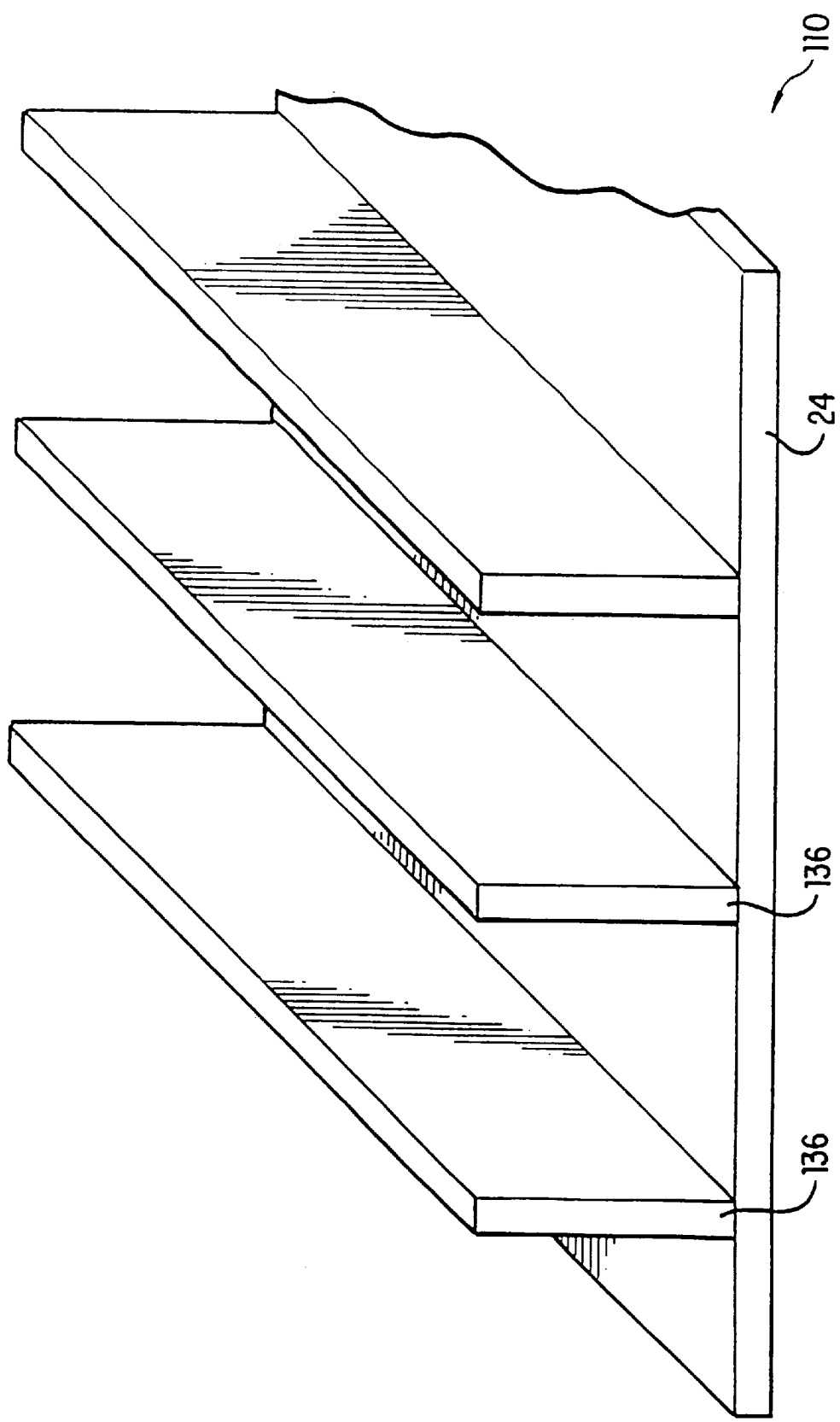
FIG. 10 is a perspective view of a portion of a semiconductor wafer at an early processing step according to the second embodiment of the present invention.

As seen in FIG. 10, formation of the storage electrode array 110 begins with deposition and subsequent etching of a conductive layer (not shown) to form a first set of runners 136 on top of the wafer 24. The conductive layer may comprise any conductive material such as patterned polysilicon, amorphous silicon, polysilicon, or the like, but is preferably polysilicon.

Figure 11:
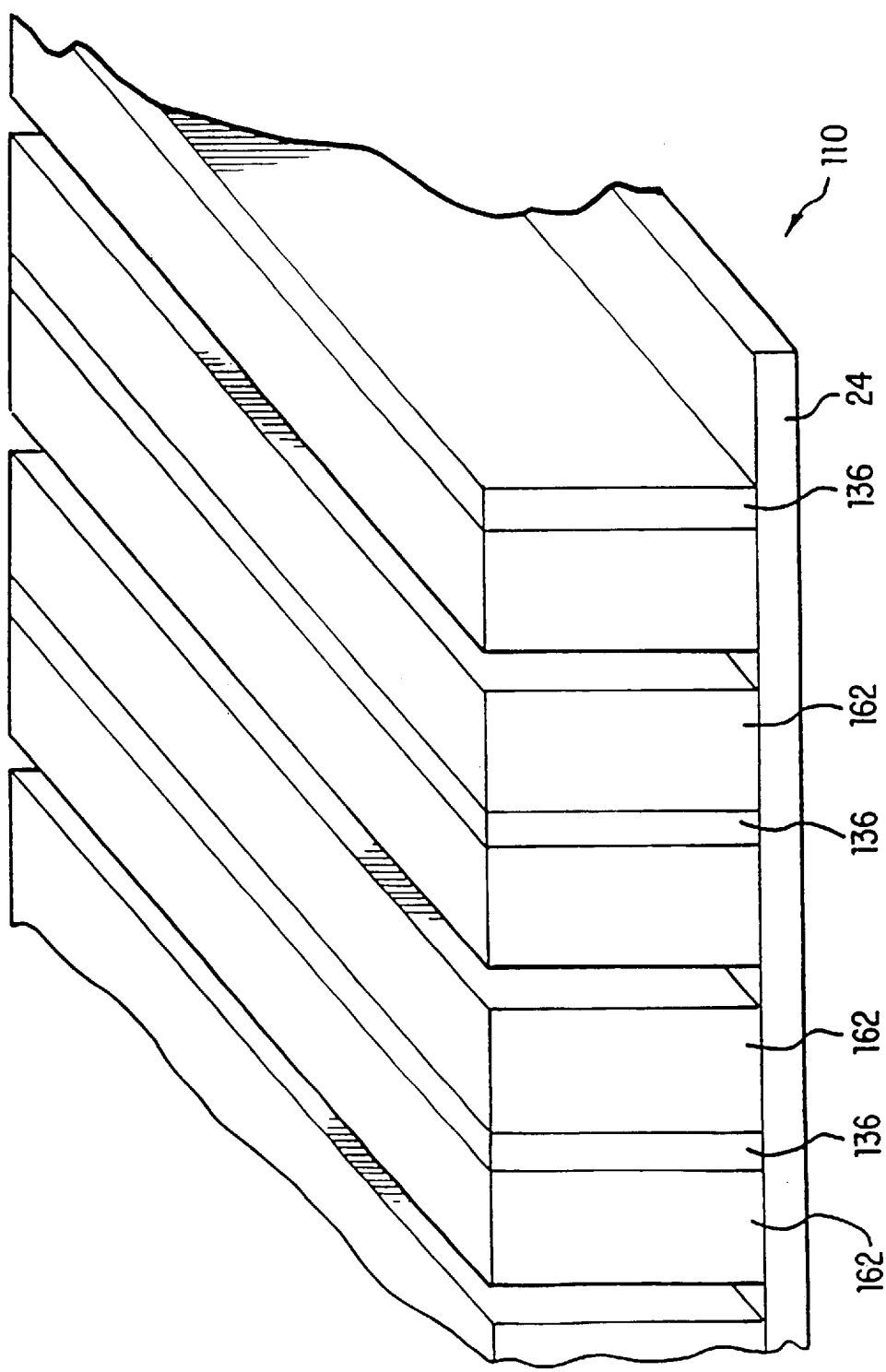
FIG. 11 is a perspective view of a portion of a semiconductor wafer at a processing step subsequent to that shown in FIG. 10.

Sacrificial spacers 162 are then formed of silicon oxide or silicon nitride ($Si_3N_4$) on the sides of the first set of runners 136, as shown in FIG. 11. If silicon oxide is used, it may be deposited by CVD or grown, and if silicon nitride is used, it is first deposited by CVD and then subsequently directionally etched to remove it from the horizontal surfaces of the wafer 24.

Figure 12:
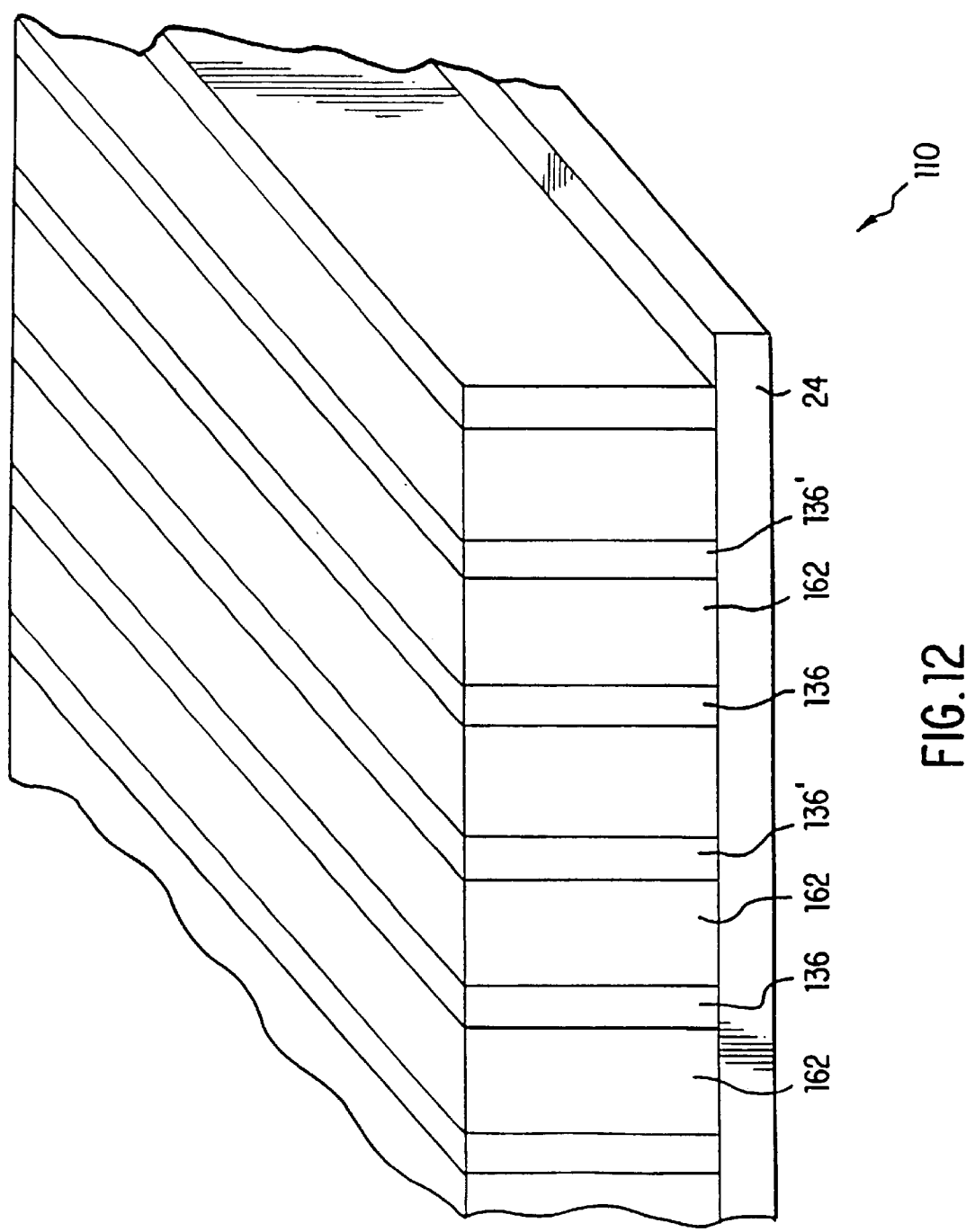
FIG. 12 is a perspective view of a portion of a semiconductor wafer at a processing step subsequent to that shown in FIG. 11.
Figure 13:
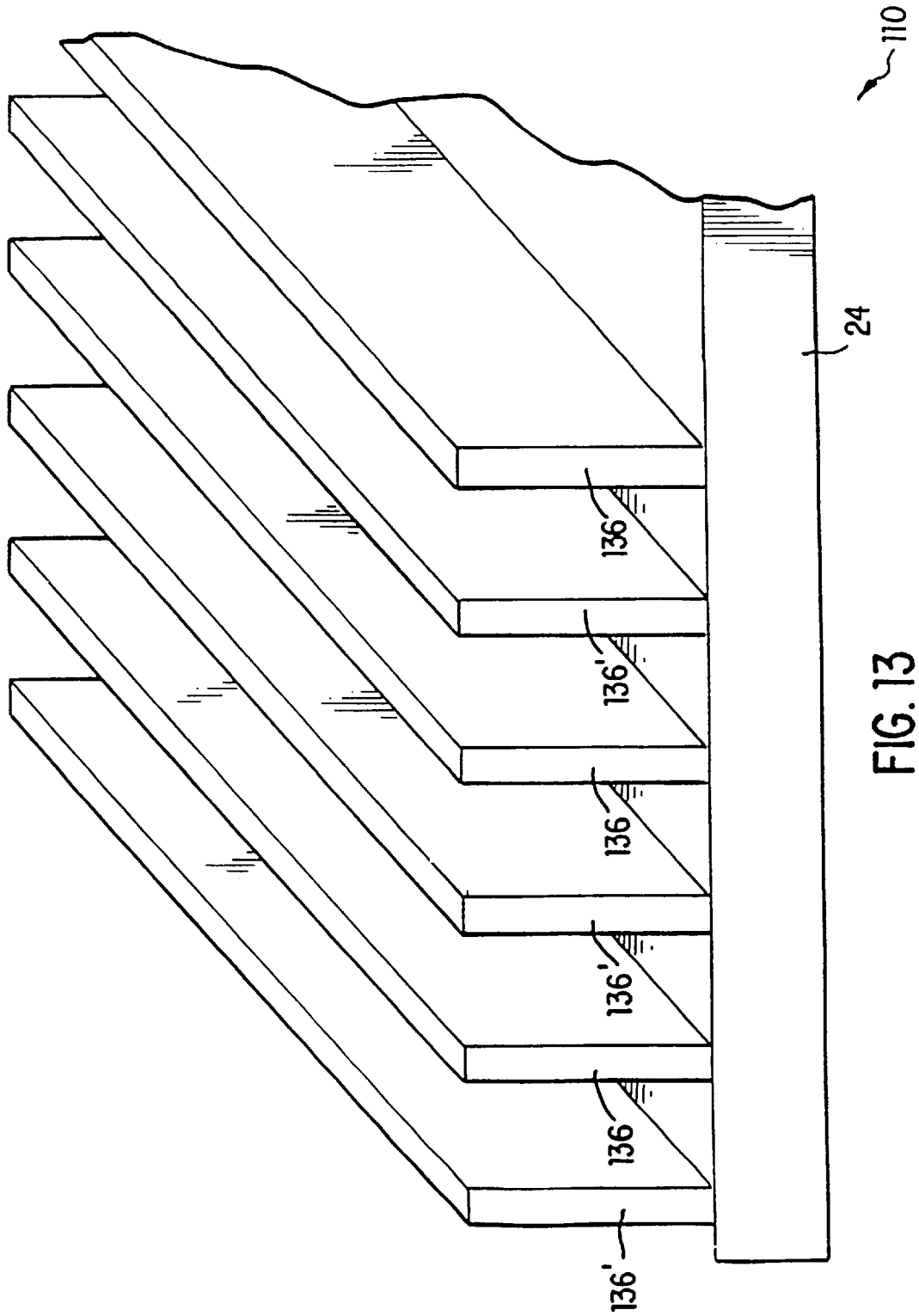
FIG. 13 is a perspective view of a portion of a semiconductor wafer at a processing step subsequent to that shown in FIG. 12.

Referring to FIG. 12, a silicon layer is then deposited over the surface of the wafer 24 and subsequently etched to form a second set of runners 136' on top of the wafer 24 and in between and parallel to the sacrificial spacers 162. The sacrificial spacers 162 are then removed by a selective etching process, leaving the structure as shown in FIG. 13. Alternatively, a sacrificial molding layer technique as described for the first embodiment may be used to form the sets of runners 136, 136' in place of the process described above.

Figure 14:
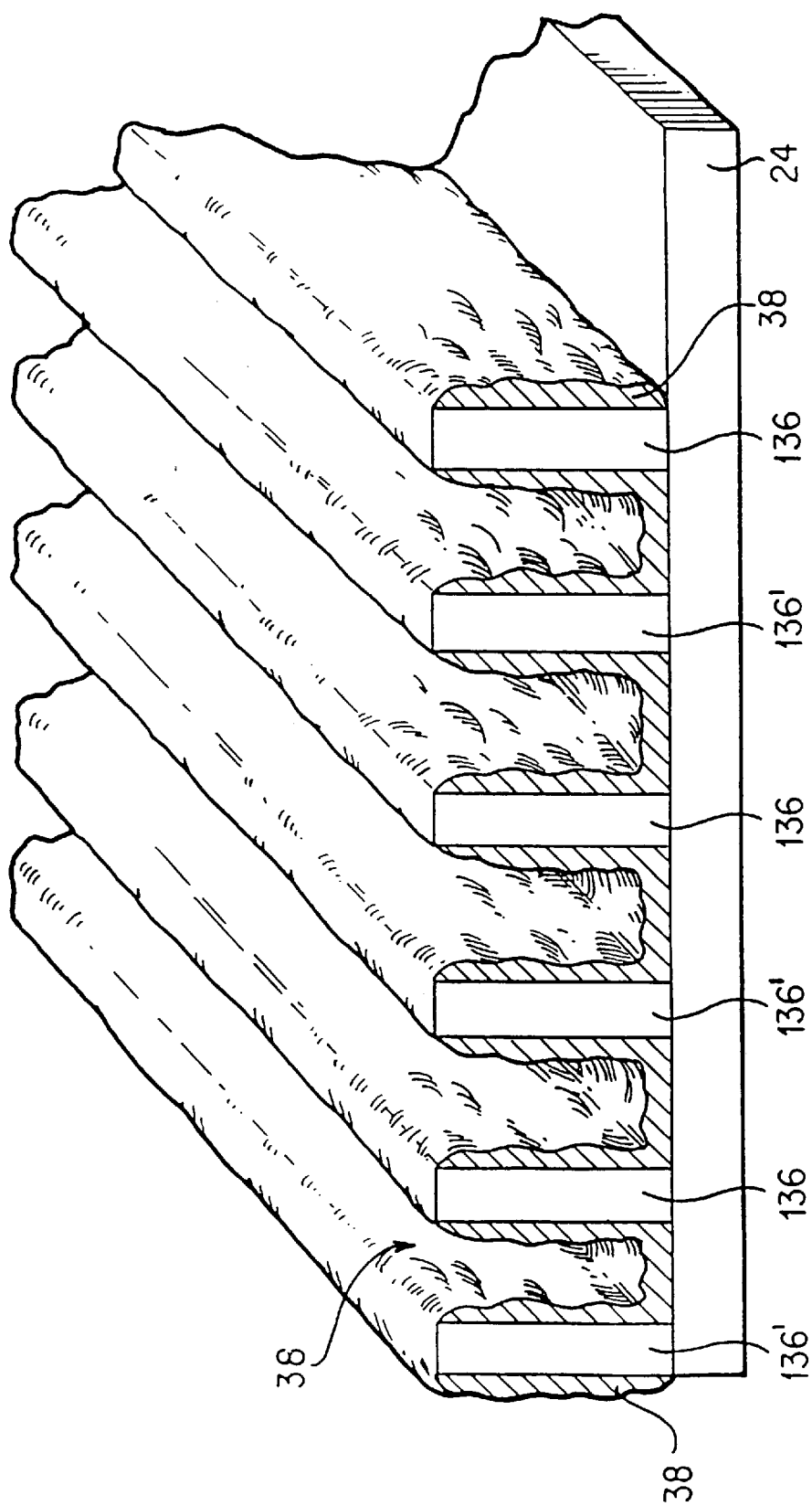
FIG. 14 is a perspective view of a portion of a semiconductor wafer at a processing step subsequent to that shown in FIG. 13.

Referring now to FIG. 14, a conductive layer 38 is then optionally deposited or formed on the inner and outer surfaces of the first and second sets of runners 136, 136'. The conductive layer 38 may be formed of polysilicon, hemispherical-grain (HSG) polysilicon, titanium nitride, or the like, but is preferably HSG polysilicon. The HSG polysilicon layer 38 may be formed by low pressure chemical vapor deposition (LPCVD) of polysilicon under controlled pressure and temperature so that nucleation occurs. Deposition of HSG polysilicon may be carried out in helium-diluted $SiH_4$ gas at 1.0 torr pressure and 550° C.

The thickness of the HSG polysilicon layer 38 is preferably less than one-half of the distance between each runner of the first set of runners 136 and each runner of the second set of runners 136'. Etch-back of the HSG polysilicon layer 38 is then performed by reactive ion etching using HBr gas without any etching masks, or by another suitable process. The resultant structure is shown in FIG. 14. Alternatively, without the optional HSG deposition, the process may proceed directly from FIG. 13 to FIG. 15, discussed below.

Figure 15:
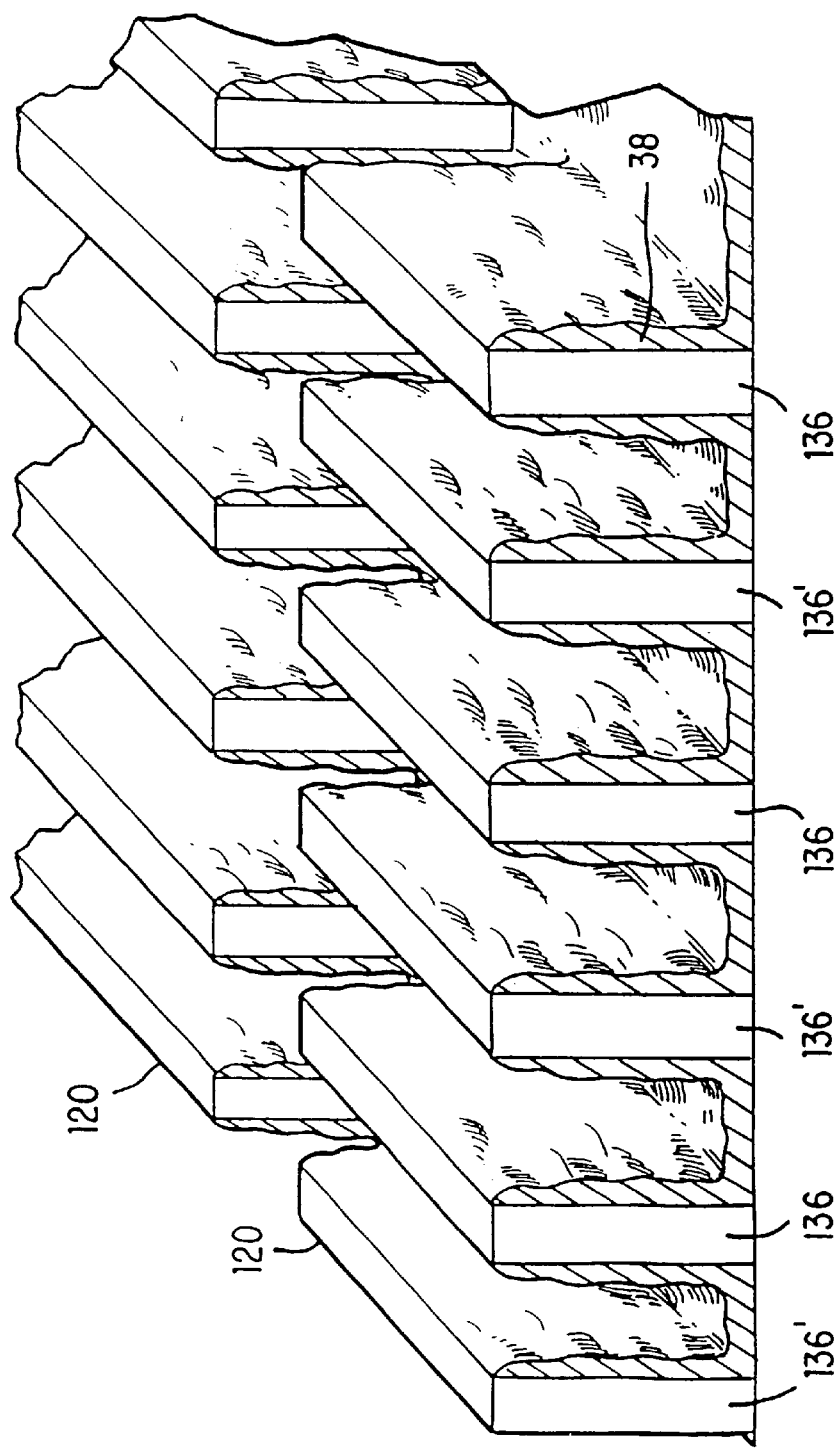
FIG. 15 is a perspective view of a portion of a semiconductor wafer at a processing step subsequent to that shown in FIG. 14.

Referring now to FIG. 15, the first and second sets of runners 136, 136' are then formed into individual storage electrodes 120. A resist and mask are applied, and a directional etching process such as RIE is used to separate the runners 136, 136' into storage electrodes 120, as shown in FIG. 15. Well established processing techniques, including deposition of a capacitor dielectric layer and a top electrode, are then performed to construct the remainder of the capacitors and to complete the array.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An integrated circuit including a first transistor and a first container capacitor, said first transistor having a source, gate and drain and said first container capacitor including a storage electrode;

a second memory cell including a second transistor and a second container capacitor, said second transistor having a source, gate and drain and said second container capacitor including a storage electrode; and a plurality of bit lines;

said storage electrodes of said first and second container capacitors entirely covering said first and second transistors in a direction of said source, gate and drain of said first and second transistors, said storage electrodes of said first and second container capacitors being formed over at least two of said plurality of bit lines.

2. The integrated circuit of claim 1, wherein said storage electrodes have a length of at least 6F where F is the minimum lithographic dimension.

3. The integrated circuit of claim 1, wherein said storage electrodes have a perimeter of greater than 12F wherein F is the minimum lithographic dimension.

4. The integrated circuit of claim 1, wherein the storage electrodes comprise hemispherical grain polysilicon.

5. The integrated circuit of claim 1, wherein the storage electrodes have a U-shaped cross-section.

6. The integrated circuit of claim 1, wherein the storage electrodes have a rectangular cross-section.

7. A memory cell array comprising:

a plurality of bit lines;

a first memory cell and a second memory cell, each cell having a transistor and a container capacitor, each of said capacitors including a storage electrode, said storage electrodes entirely covering the transistors of the first and second memory cells in a direction of a source, gate and drain, said storage electrodes being formed over at least two of said plurality of bit lines.

8. The memory cell array of claim 7, wherein each storage electrode comprises two rectangular runners at least partially coated and connected by a conductive layer.

9. The memory cell array of claim 8, wherein said conductive layer is hemispherical grain polysilicon.

10. The memory cell array of claim 7, wherein each storage electrode comprises one rectangular runner.

* * * * *